(12) United States Patent
Jang

(10) Patent No.: US 11,557,252 B2
(45) Date of Patent: Jan. 17, 2023

(54) STAGE AND EMISSION CONTROL DRIVER HAVING THE SAME

(71) Applicant: Samsung Display Co., Ltd., Yongin-si (KR)

(72) Inventor: Hwan Soo Jang, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 184 days.

(21) Appl. No.: 16/821,490

(22) Filed: Mar. 17, 2020

(65) Prior Publication Data

US 2020/0302870 A1 Sep. 24, 2020

(30) Foreign Application Priority Data

Mar. 18, 2019 (KR) .................. 10-2019-0030721

(51) Int. Cl.
*G09G 3/3266* (2016.01)
*G09G 3/3258* (2016.01)

(52) U.S. Cl.
CPC ....... *G09G 3/3258* (2013.01); *G09G 2300/08* (2013.01); *G09G 2310/06* (2013.01)

(58) Field of Classification Search
None
See application file for complete search history.

(56) References Cited

U.S. PATENT DOCUMENTS

| | | | |
|---|---|---|---|
| 9,454,934 B2 | 9/2016 | Woo | |
| 9,548,025 B2 | 1/2017 | Kim et al. | |
| 9,548,026 B2 | 1/2017 | Jang | |
| 10,311,781 B2 | 6/2019 | Lee et al. | |
| 2017/0345366 A1 | 11/2017 | Jang | |
| 2017/0365211 A1 | 12/2017 | Lee et al. | |
| 2018/0330673 A1* | 11/2018 | Kang | ........... G09G 3/3266 |
| 2019/0197956 A1 | 6/2019 | Wu et al. | |
| 2019/0287457 A1 | 9/2019 | Lee et al. | |

FOREIGN PATENT DOCUMENTS

| | | |
|---|---|---|
| EP | 2814062 | 12/2014 |
| EP | 3258464 | 12/2017 |
| KR | 10-2014-0025149 | 3/2014 |
| KR | 10-2015-0025539 A | 3/2015 |
| KR | 10-2017-0133578 | 12/2017 |
| KR | 10-2017-0143052 | 12/2017 |

* cited by examiner

*Primary Examiner* — Carl Adams
(74) *Attorney, Agent, or Firm* — H.C. Park & Associates, PLC

(57) ABSTRACT

A stage circuit including: an output circuit for supplying a voltage of a first or second power supply to an output terminal in response to voltages of first and second nodes; an input circuit for controlling voltages of the second node and a third node; a first signal processor for controlling the voltage of the first node; a second signal processor configured to control the voltage of the first node in response to an output voltage of a third signal processor and a signal supplied to a third input terminal; and the third signal processor for controlling the voltage of the second node. The third signal processor includes: a third capacitor coupled between the first power supply and the second node; and a third transistor coupled between the first power supply and the third input terminal, and including a gate electrode coupled to the second node.

18 Claims, 10 Drawing Sheets

STAGE AND EMISSION CONTROL DRIVER HAVING THE SAME

CROSS-REFERENCE TO RELATED APPLICATION

This application claims priority from and the benefit of Korean Patent Application No. 10-2019-0030721, filed on Mar. 18, 2019, which is hereby incorporated by reference for all purposes as if fully set forth herein.

BACKGROUND

Field

Exemplary embodiments of the invention relate generally to a stage circuit (stage) and an emission control driver having the same.

Discussion of the Background

An organic light emitting display (OLED) has advantages over other types of displays in that the response speed thereof is higher and it is has lower power consumption.

An emission control driver provided in the OLED may control emission times of pixels by supplying emission control signals to emission control lines. For this operation, the emission control driver includes a plurality of stages coupled to the respective emission control lines. Each of the stages may include a plurality of transistors and a capacitor.

The above information disclosed in this Background section is only for understanding of the background of the inventive concepts, and, therefore, it may contain information that does not constitute prior art.

SUMMARY

Exemplary embodiments of the present invention provide a stage circuit capable of stably maintaining the voltage of a node for controlling the output of an emission control signal at a high voltage while the emission control signal is maintained at a low voltage, and an emission control driver having the stage.

Exemplary embodiments of the present invention also provide a stage circuit configured such that a capacitor provided in the stage may be prevented from being charged or discharged while the emission control signal is maintained at a low voltage, and an emission control driver having the stage.

Additional features of the inventive concepts will be set forth in the description which follows, and in part will be apparent from the description, or may be learned by practice of the inventive concepts.

An exemplary embodiment of the present invention provides a stage circuit including: an output circuit configured to supply a voltage of a first power supply or a voltage of a second power supply to an output terminal in response to a voltage of a first node and a voltage of a second node; an input circuit configured to control a voltage of the second node and a voltage of a third node in response to respective signals supplied to a first input terminal and a second input terminal; a first signal processor configured to control the voltage of the first node in response to the voltage of the second node; a second signal processor coupled between the first node and the third node, and configured to control the voltage of the first node in response to an output voltage of a third signal processor and a signal supplied to a third input terminal; and the third signal processor configured to control the voltage of the second node in response to a signal supplied to the first input terminal. The third signal processor includes: a third capacitor coupled between the first power supply and the second node and a third transistor coupled between the first power supply and the third input terminal, and including a gate electrode coupled to the second node.

When the voltage of the first power supply is supplied to the output terminal in response to the voltage of the second node, the third transistor may be turned off so that a path of current flowing from the second input terminal to the second node is blocked.

A difference in potential between opposite ends of the third capacitor may remain constant while the voltage of the first power supply is supplied to the output terminal in response to the voltage of the second node.

The third signal processor may further include a second transistor coupled between the first power supply and a common node between the third capacitor and the third transistor, the second transistor including a gate electrode coupled to the third node. When the voltage of the first power supply is supplied to the output terminal in response to the voltage of the second node, the voltage of the first power supply may be applied to the second node via the second transistor and the third capacitor.

The second input terminal may be supplied with a first clock signal, the third input terminal may be supplied with a second clock signal, and the first clock signal and the second clock signal may have identical waveforms with a phase difference of a half cycle or more.

A gate-on voltage section of the signal supplied to the first input terminal may overlap at least once with a gate-on voltage section of the first clock signal.

The third signal processor may further include: a fourth transistor coupled between the third node and the second input terminal, and including a gate electrode coupled to the second node; and a fifth transistor coupled between the third node and the second power supply, and including a gate electrode coupled to the second input terminal.

The fourth transistor may include a plurality of sub-transistors coupled in series between the third node and the second input terminal. Gate electrodes of the plurality of sub-transistors may be coupled to the second node.

The third signal processor may include: a thirteenth transistor coupled between the first power supply and an eighth node, and including a gate electrode coupled to the third node; and a fourteenth transistor coupled between the eighth node and the second node, and including a gate electrode coupled to the third input terminal.

The input circuit may include a first transistor coupled between the first input terminal and the second node, the first transistor including a gate electrode coupled to the second input terminal.

The second signal processor may include: a second capacitor coupled between the third node and a sixth node; a sixth transistor coupled between the sixth node and the third input terminal, and including a gate electrode coupled to the third node; and a seventh transistor coupled between the first node and the sixth node, and including a gate electrode coupled to the third input terminal.

The first signal processor may include: a first capacitor coupled between the first power supply and the first node; and an eighth transistor coupled between the first power supply and the first node, and including a gate electrode coupled to the second node.

The output circuit may include: a ninth transistor coupled between the first power supply and the output terminal, and including a gate electrode coupled to the first node; and a tenth transistor coupled between the output terminal and the second power supply, and including a gate electrode coupled to the second node.

The stage circuit may further include a first stabilizer coupled between the second signal processor and the third signal processor and configured to control a voltage drop width of the third node.

The stage circuit may further include a second stabilizer coupled between the second node and a fourth node coupled to the first input terminal, the second stabilizer being configured to control a voltage drop width of the second node.

The stage circuit may further include: a first gate insulating layer configured to cover a source electrode and a drain electrode of at least one transistor; a second gate insulating layer configured to cover a gate electrode of at least one transistor and a first electrode of at least one capacitor; and an interlayer insulating layer configured to cover a second electrode of the at least one capacitor. The second gate insulating layer may cover a line extending from the gate electrode of the third transistor to the second node. The line may be disposed not to overlap with the source electrode and the drain electrode that are covered with the first gate insulating layer, or the second electrode that is covered with the interlayer insulating layer.

Another exemplary embodiment of the present invention provides an emission control driver including a plurality of stages configured to supply emission signals to emission control lines. Each of the stage circuits may include: an output circuit configured to supply a voltage of a first power supply or a voltage of a second power supply to an output terminal in response to a voltage of a first node and a voltage of a second node; an input circuit configured to control a voltage of the second node and a voltage of a third node in response to respective signals supplied to a first input terminal and a second input terminal; a first signal processor configured to control the voltage of the first node in response to the voltage of the second node; a second signal processor connected between the first node and the third node, and configured to control the voltage of the first node in response to a signal supplied to the second input terminal and a signal supplied to a third input terminal; and a third signal processor configured to control the voltage of the second node in response to a signal supplied to the first input terminal. The third signal processor may include: a third capacitor coupled between the first power supply and the second node; and a third transistor coupled between the first power supply and the third input terminal, and including a gate electrode coupled to the second node.

When the voltage of the first power supply is supplied to the output terminal in response to the voltage of the second node, the third transistor may be turned off so that a path of current flowing from the second input terminal to the second node is blocked.

A difference in potential between opposite ends of the third capacitor may remain constant while the voltage of the first power supply is supplied to the output terminal in response to the voltage of the second node.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
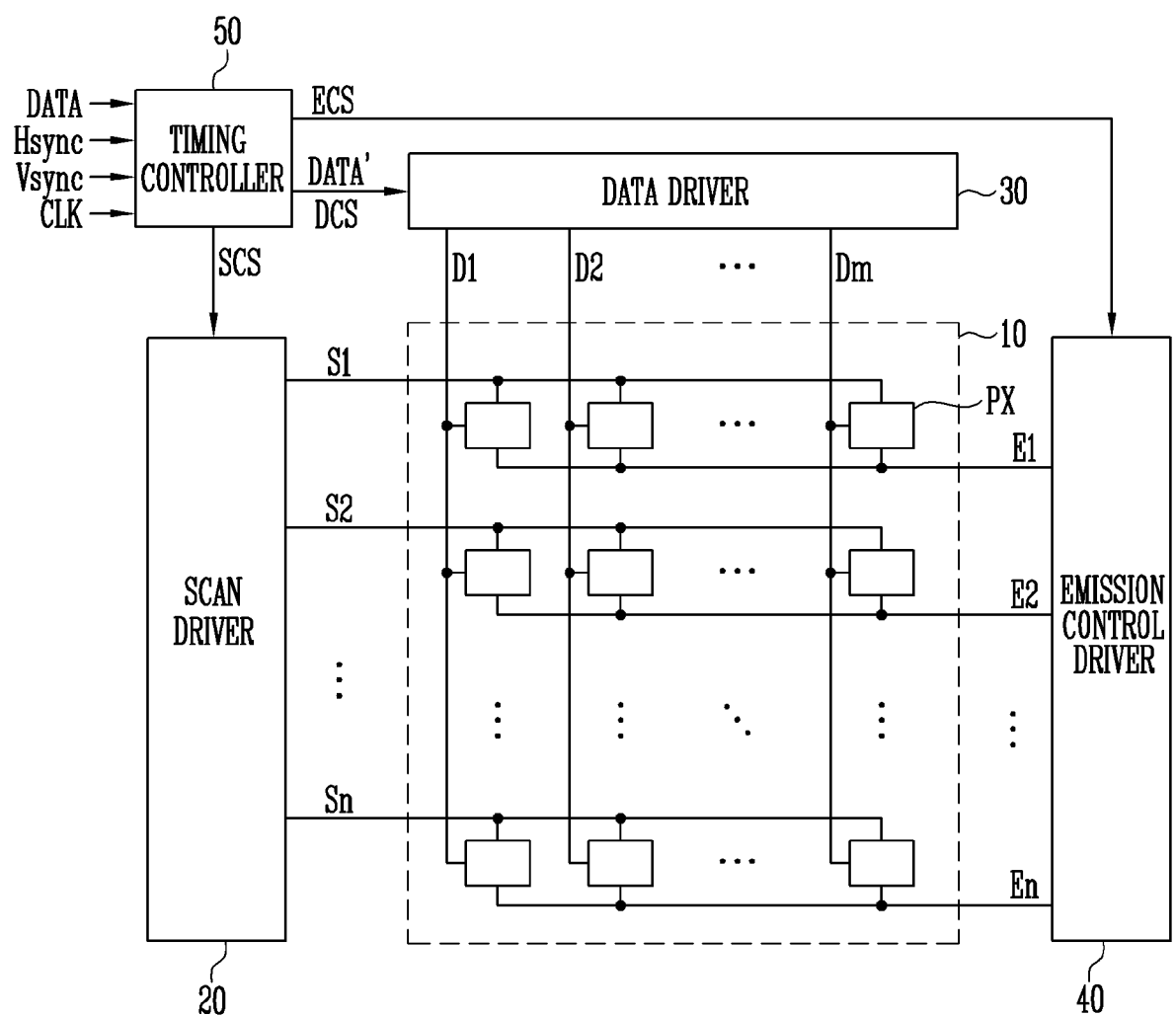
FIG. 1 is a diagram illustrating a display device in accordance with exemplary embodiments of the present invention.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a diagram illustrating a display device in accordance with exemplary embodiments of the present invention.

Referring to FIG. 1, a display device in accordance with an exemplary embodiment of the present invention may include a pixel unit 10, a scan driver 20, a data driver 30, an emission control driver 40, and a timing controller 50.

The pixel unit 10 may include a plurality of pixels PX which are coupled with scan lines S1 to Sn, data lines D1 to Dm, and emission control lines E1 to En and arranged in the form of a matrix. The pixels PX may receive scan signals through the scan lines S1 to Sn, receive data signals through the data lines D1 to Dm, and receive emission control signals through the emission control lines E1 to En. The pixels PX may emit light at luminance levels corresponding to data signals supplied from the data lines D1 to Dm when scan signals are supplied from the scan lines S1 to Sn to the pixels PX.

The scan driver 20 may be coupled with the plurality of scan lines S1 to Sn, generate scan signals in response to a scan driving control signal SCS of the timing controller 50, and output the generated scan signals to the scan lines S1 to Sn. The scan driver 20 may be formed of a plurality of stage circuits. When scan signals are sequentially supplied to the scan lines S1 to Sn, the pixels PX may be selected on a horizontal line basis.

The data driver 30 may be coupled to the plurality of data lines D1 to Dm, generate data signals based on image data DATA' and a data driving control signal DCS of the timing controller 50, and output the generated data signals to the data lines D1 to Dm. Each time a scan signal is supplied, the data signals supplied to the data lines D1 to Dm may be supplied to pixels PX selected by the scan signal. Then, the pixels PX may charge voltages corresponding to the data signals.

The emission control driver 40 may be coupled with the emission control lines E1 to En, generate emission control signals in response to an emission driving control signal ECS of the timing controller 50, and output the generated emission control signals to the emission control lines E1 to En. The emission control driver 40 may be formed of a plurality of stage circuits, and control emission periods of the pixels PX by supplying the emission control signals to the emission control lines E1 to En.

The timing controller 50 may receive image data DATA, and synchronization signals Hsync and Vsync, clock signals CLK, etc., for controlling display of an image corresponding to the image data DATA. The timing controller 50 may image-process the input image data DATA, generate compensated image data DATA' suitable for image display of the pixel unit 10, and output the image data DATA' to the data driver 30. The timing controller 50 may generate driving control signals SCS, DCS, and ECS for controlling the operations of the scan driver 20, the data driver 30, and the emission control driver 40 based on the synchronization signals Hsync and Vsync and the clock signal CLK. In detail, the timing controller 50 may generate a scan driving control signal SCS and supply the scan driving control signal SCS to the scan driver 20, may generate a data driving control signal DCS and supply the data driving control signal DCS to the data driver 30, and may generate an emission driving control signal ECS and supply the emission driving control signal ECS to the emission control driver 40.

Figure 2:
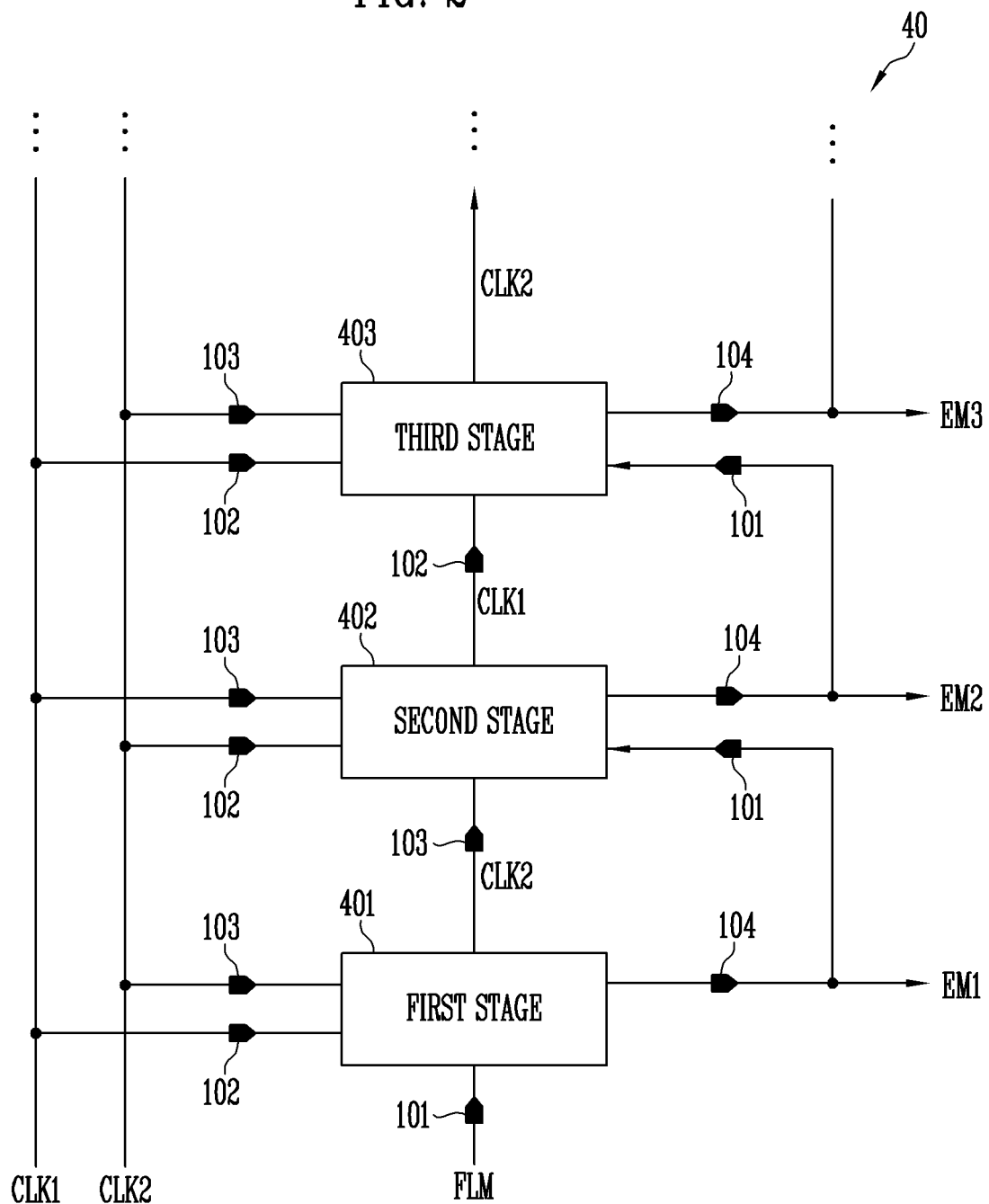
FIG. 2 is a diagram schematically illustrating an emission control driver illustrated in FIG. 1.

FIG. 2 is a diagram schematically illustrating the emission control driver 40 illustrated in FIG. 1.

Referring to FIGS. 1 and 2 together, the emission control driver 40 in accordance with an exemplary embodiment of the present invention may include a plurality of stages 401, 402, 403, . . . to supply emission control signals to the emission control lines E1 to En. In the present exemplary embodiment, for the sake of explanation, only three stages 401, 402, and 403 are illustrated.

The stages 401, 402, and 403 may be driven by a start signal FLM and first and second clock signals CLK1 and CLK2 and respectively output emission control signals EM1, EM2, and EM3. The start signal FLM and the first and second clock signals CLK1 and CLK2 may be received through emission driving control signals ECS provided from the timing controller 50.

In exemplary embodiments of the present invention, the stages 401, 402, and 403 may be formed of identical or different circuits.

Each of the stages 401, 402, 403, . . . may include a first input terminal 101, a second input terminal 102, a third input terminal 103, and an output terminal 104.

The first input terminal 101 may be supplied with a start signal FLM or an emission control signal EM1, EM2, EM3, . . . of a preceding stage. The second input terminal 102 and the third input terminal 103 may be supplied with any one of the first and second clock signals CLK1 and CLK2. A signal output to the output terminal 104 may be used as an emission control signal EM1, EM2, EM3, . . . .

In exemplary embodiments, each of the first and second clock signals CLK1 and CLK2 may be set as a square wave signal having a logical high level and a logical low level which are repeatedly formed. The first and second clock signals CLK1 and CLK2 may be signals having the same waveform with two horizontal periods 2H per one cycle. In exemplary embodiments, the first and second clock signals CLK1 and CLK2 may be set such that gate-on voltage periods thereof do not overlap each other with a phase difference of a half cycle or more. However, this is only for illustrative purposes, and the waveform relationship between the first and second clock signals CLK1 and CLK2 is not limited thereto.

The first stage 401 of the stages 401, 402, 403, . . . may receive the start signal FLM, and each of the stages 402, 403, . . . other than the first stage 401 may receive the emission control signal EM1, EM2, EM3, . . . of a preceding stage.

In an exemplary embodiment, the first stage 401 may directly receive the first and second clock signals CLK1 and CLK2, and each of the stages 402, 403, . . . other than the first stage 401 may receive any one of the first and second clock signals CLK1 and CLK2 from the preceding stage. In detail, each of the odd-number-th stages 403, . . . other than the first stage 401 may receive the first clock signal CLK1 from the preceding stage and directly receive the second clock signal CLK2. Each of the even-number-th stages 402, . . . may directly receive the first clock signal CLK1 and receive the second clock signal CLK2 from the preceding stage. However, the inventive concepts are not limited thereto, and all of the stages 401, 402, 403, . . . may directly receive the first and second clock signals CLK1 and CLK2.

In an exemplary embodiment of FIG. 2, the first stage 401 may output a first emission control signal EM1 in response to the start signal FLM and the first and second clock signals CLK1 and CLK2, and transmit the second clock signal CLK2 and the first emission control signal EM1 to the second stage 402. The second stage 402 may output a second emission control signal EM2 in response to the first clock signal CLK1, and the second clock signal CLK2 and the first emission control signal EM1 that are transmitted from the first stage 401, and transmit the first clock signal CLK1 and the second emission control signal EM2 to the third stage 403. The third stage 403 may output a third emission control signal EM3 in response to the second clock signal CLK2, and the first clock signal CLK1 and second emission control signal EM2 that are transmitted from the second stage 402, and transmit the second clock signal CLK2 and the third emission control signal EM3 to the fourth stage (not illustrated).

Figure 3:
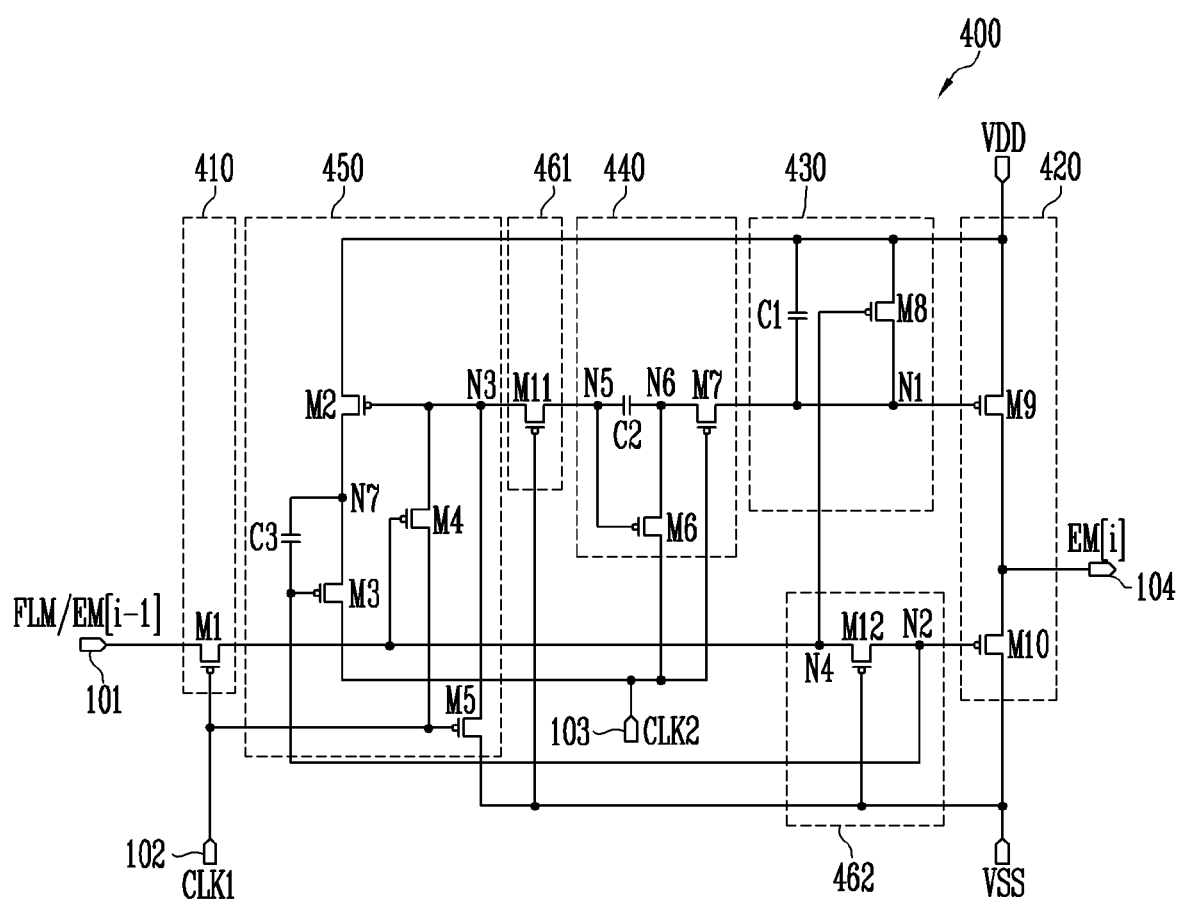
FIG. 3 is a circuit diagram of a stage illustrated in FIG. 2 in accordance with a first exemplary embodiment of the present invention.
Figure 4:
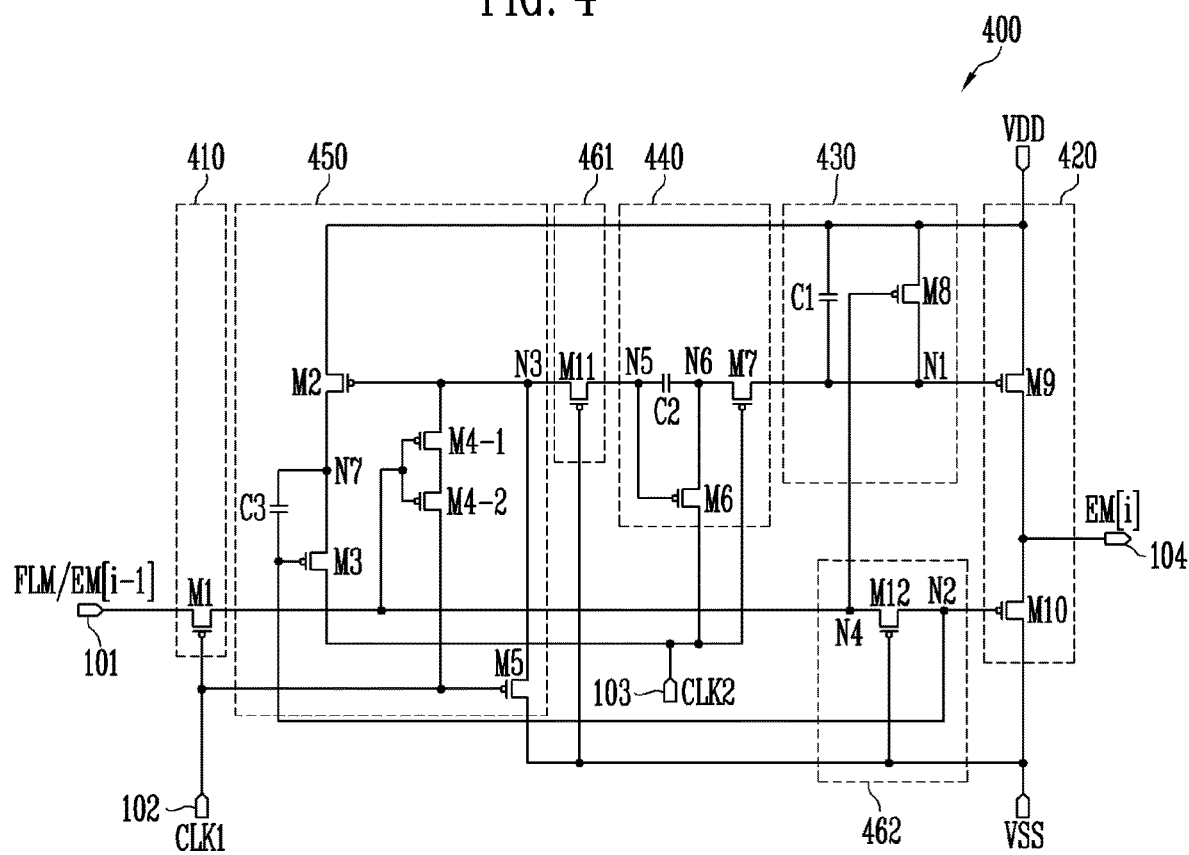
FIG. 4 is a circuit diagram of a stage illustrated in FIG. 2 in accordance with a second exemplary embodiment of the present invention.

FIG. 3 is a circuit diagram of a stage illustrated in FIG. 2 in accordance with a first exemplary embodiment, and FIG. 4 is a circuit diagram of a stage illustrated in FIG. 2 in accordance with a second exemplary embodiment. Although for the sake of explanation FIGS. 3 and 4 illustrate only an i-th stage, the stages illustrated in FIG. 2 may have the same structure as that of the i-th stage to be described below.

Referring to FIGS. 1 to 3, the stage 400 in accordance with the first exemplary embodiment of the present invention may include an input circuit 410, an output circuit 420, a first signal processor 430, a second signal processor 440, a third signal processor 450, a first stabilizer 461, and a second stabilizer 462.

The output circuit 420 may supply the voltage of a first power supply VDD or a second power supply VSS to an output terminal 104 in response to voltages of a first node N1 and a second node N2. To this end, the output circuit 420 may include a ninth transistor M9 and a tenth transistor M10.

The ninth transistor M9 is coupled between the first power supply VDD and the output terminal 104. A gate electrode of the ninth transistor M9 may be coupled to the first node N1. The ninth transistor M9 may be turned on or off depending on the voltage of the first node N1. Here, the voltage of the first power supply VDD that is supplied to the output terminal 104 when the ninth transistor M9 is turned on may be supplied to an i-th emission control line Ei and used as an emission control signal EM[i] having a gate-on level.

The tenth transistor M10 is coupled between the output terminal 104 and the second power supply VSS. A gate electrode of the tenth transistor M10 is coupled to the second node N2. The tenth transistor M10 may be turned on or off depending on the voltage of the second node N2. Here, the voltage of the second power supply VSS that is supplied to the output terminal 104 when the tenth transistor M10 is turned on may be supplied to an i-th emission control line Ei and used as an emission control signal EM[i] having a gate-off level. In an exemplary embodiment, when the emission control signal EM[i] has a gate-off level, it may be understood that the emission control signal EM[i] is not supplied.

The input circuit 410 may control the voltages of the second node N2 and a fourth node N4 in response to signals supplied to the first input terminal 101 and the second input terminal 102. To this end, the input circuit 410 may include a first transistor M1.

The first transistor M1 is coupled between the first input terminal 101 and the fourth node N4. A gate electrode of the first transistor M1 is coupled to the second input terminal 102. When the first clock signal CLK1 is supplied to the second input terminal 102, the first transistor M1 may be turned on to electrically couple the first input terminal 101 with the fourth node N4.

The first signal processor 430 may control the voltage of the first node N1 in response to the voltages of the second node N2 and the fourth node N4. To this end, the first signal processor 430 may include an eighth transistor M8 and a first capacitor C1.

The eighth transistor M8 is coupled between the first power supply VDD and the first node N1. A gate electrode of the eighth transistor M8 may be coupled to the fourth node N4. The eighth transistor M8 may be turned on or off depending on the voltage of the fourth node N4. Here, when the eighth transistor M8 is turned on, the voltage of the first power supply VDD may be supplied to the first node N1.

The first capacitor C1 is coupled between the first power supply VDD and the first node N1. The first capacitor C1 may charge a voltage to be applied to the first node N1. Furthermore, the first capacitor C1 may stably maintain the voltage of the first node N1.

The second signal processor 440 is coupled to a fifth node N5, and may control the voltage of the first node N1 in response to a signal input to the third input terminal 103. To this end, the second signal processor 440 may include a sixth transistor M6, a seventh transistor M7, and a second capacitor C2.

A first terminal of the second capacitor C2 is coupled to the fifth node N5, and a second terminal thereof is coupled to a sixth node N6 that is a common node between the sixth transistor M6 and the seventh transistor M7.

The sixth transistor M6 is coupled between the sixth node N6 and the third input terminal 103. A gate electrode of the sixth transistor M6 is coupled to the fifth node N5. The sixth transistor M6 may be turned on depending on the voltage of the fifth node N5 so that a voltage corresponding to the second clock signal CLK2 supplied to the third input terminal 103 may be applied to the sixth node N6.

The seventh transistor M7 is coupled between the first power supply VDD and the sixth node N6. A gate electrode of the seventh transistor M7 is coupled to the third input terminal 103. The seventh transistor M7 may be turned on in response to the second clock signal CLK2 supplied to the third input terminal 103, and thus, applies the voltage of the first power supply VDD to the sixth node N6.

The third signal processor 450 may control the voltage of the third node N3. To this end, the third signal processor 450 may include a second transistor M2, a third transistor M3, a fourth transistor M4, a fifth transistor M5, and a third capacitor C3.

A first electrode of the third capacitor C3 is coupled to the second node N2, and a second electrode thereof is coupled to a seventh node N7 that is a common node between the second transistor M2 and the third transistor M3.

The second transistor M2 is coupled between the first power supply VDD and the seventh node N7. A gate electrode of the second transistor M2 is coupled to the third node N3. The second transistor M2 may be turned on or off depending on the voltage of the third node N3.

The third transistor M3 is coupled between the seventh node N7 and the third input terminal 103. A gate electrode of the third transistor M3 is coupled to the second node N2. The third transistor M3 may be turned on or off depending on the voltage of the second node N2.

The fourth transistor M4 is coupled between the third node N3 and the second input terminal 102. A gate electrode of the fourth transistor M4 is coupled to the fourth node N4. In an exemplary embodiment of the present invention, as illustrated in FIG. 4, the fourth transistor M4 may include 4-1-th and 4-2-th sub-transistors M4-1 and M4-2 which are coupled in series between the third node N3 and the second input terminal 102. In this exemplary embodiment, a gate electrode of each of the 4-1-th and 4-2-th sub-transistors M4-1 and M4-2 is coupled to the fourth node N4. If the fourth transistor M4 is formed of a plurality of sub-transistors M4-1 and M4-2, even when there is a large difference in potential between the third node N3 and the fourth node N4, a current path may be reliably formed between the third node N3 and the second input terminal 102 in response to the potential difference between the third node N3 and the fourth node N4.

The fifth transistor M5 is coupled between the third node N3 and the second power supply VSS. A gate electrode of the fifth transistor M5 is coupled to the second input terminal 102. When the first clock signal CLK1 is supplied to the second input terminal 102, the fifth transistor M5 may be turned on so that the voltage of the second power supply VSS may be supplied to the third node N3.

The first stabilizer 461 is coupled between the second signal processor 440 and the third signal processor 450. The first stabilizer 461 may limit a voltage drop width of the third node N3. To this end, the first stabilizer 461 may include an eleventh transistor M11.

The eleventh transistor M11 is coupled between the third node N3 and the fifth node N5. A gate electrode of the eleventh transistor M11 is coupled to the second power supply VSS. Since the second power supply VSS has a gate-on level voltage, the eleventh transistor M11 may always remain turned on. Therefore, the third node N3 and the fifth node N5 may be maintained at the same voltage, and operated as substantially the same node.

The second stabilizer 462 is coupled between the second node N2 and the fourth node N4. The second stabilizer 462 may limit a voltage drop width of the second node N2. To this end, the second stabilizer 462 may include a twelfth transistor M12.

The twelfth transistor M12 is coupled between the second node N2 and the fourth node N4. A gate electrode of the twelfth transistor M12 is coupled to the second power supply VSS. Since the second power supply VSS has a gate-off level voltage, the twelfth transistor M12 may always remain turned on. Therefore, the second node N2 and the fourth node N4 may be maintained at the same voltage, and operated as substantially the same node.

In exemplary embodiments of the present invention, each of the first to twelfth transistors M1 to M12 may be formed of a p-type transistor. In these exemplary embodiments, the gate-on voltage of the first to twelfth transistors M1 to M12 may be set to a low level, and the gate-off voltage thereof may be set to a high level.

Figure 5:
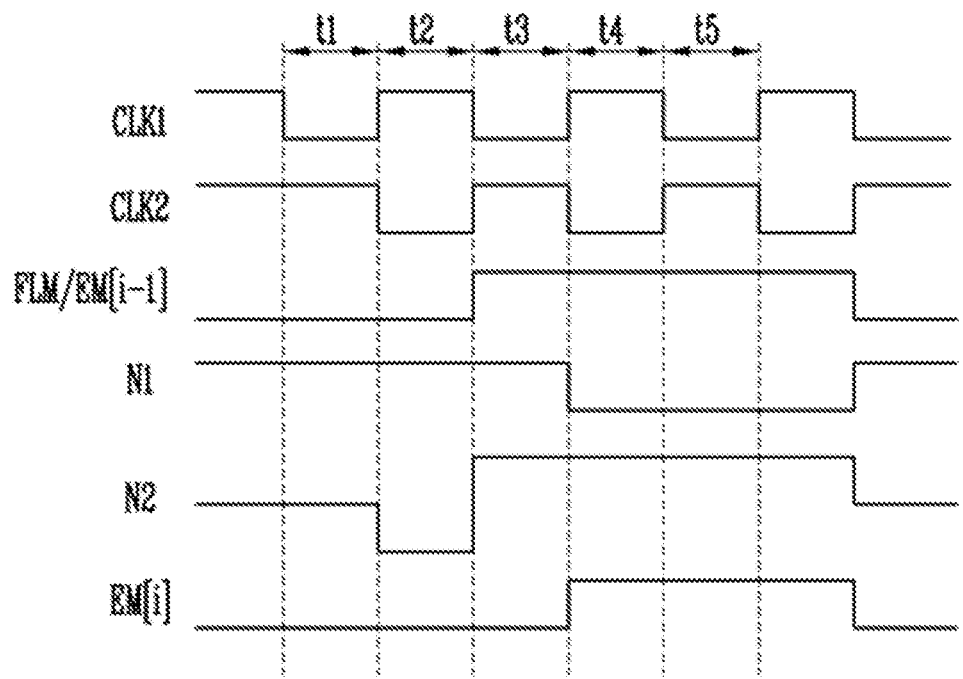
FIG. 5 is a waveform diagram illustrating an operation of the stage illustrated in FIG. 3.

FIG. 5 is a waveform diagram illustrating an operation of the stage illustrated in FIG. 3. For the sake of explanation, FIG. 5 illustrates the operation of only the i-th stage.

Referring to FIG. 5, the first clock signal CLK1 and the second clock signal CLK2 each may have a cycle of two horizontal periods (2H), and have a gate-on level during different horizontal periods. In other words, the second clock signal CLK2 may be set to a signal shifted by a half cycle (i.e., one horizontal period (1H)) from the first clock signal CLK1.

When the clock signals CLK1 and CLK2 are supplied, the second input terminal 102 and the third input terminal 103 may be set to the low level, i.e., the voltage of the second power supply VSS. When the clock signals CLK1 and CLK2 are not supplied, the second input terminal 102 and the third input terminal 103 may be set to the high level, i.e., the voltage of the first power supply VDD.

When the start signal FLM or the emission control signal EM[i−1] of the preceding stage is supplied, the first input terminal 101 may be set to the high level, i.e., the voltage of the first power supply VDD. When the start signal FLM or the emission control signal EM[i−1] of the preceding stage is not supplied, the first input terminal 101 may be set to the low level, i.e., the voltage of the second power supply VSS.

Furthermore, the start signal FLM or the emission control signal EM[i−1] of the preceding stage to be supplied to the first input terminal 101 may be set to overlap at least once with the first clock signal CLK1 to be supplied to the second input terminal 102. To this end, the start signal FLM (or the emission control signal EM[i−1] of the preceding stage) may have a width greater than that of the first clock signal CLK1 and, for example, be supplied during four horizontal periods (4H). In this case, a first emission control signal to be supplied to the first input terminal 101 of the following stage may also overlap at least once with the second clock signal CLK2 to be supplied to the second input terminal 102 of the following stage.

A process of the operation will be described. First, during a first period t1, the first clock signal CLK1 may be supplied to the second input terminal 102. Thereby, the first transistor M1 and the fifth transistor M5 may be turned on. Furthermore, during the first period t1, the second clock signal CLK2 may not be supplied to the third input terminal 103. Hence, the seventh transistor M7 may be turned off.

When the first transistor M1 is turned on, the first input terminal 101 and the fourth node N4 may be electrically coupled to each other. Since the twelfth transistor M12 remains turned on, the first input terminal 101 may also be electrically coupled with the second node N2 via the fourth node N4.

Since during the first period t1 the start signal FLM or the emission control signal EM[i−1] of the preceding stage to be supplied to the first input terminal 101 has the low level, a low voltage (e.g., the voltage of the second power supply VSS) may be applied to the fourth node N4 and the second node N2. When the fourth node N4 and the second node N2 are set to the low voltage, the third transistor M3, the fourth transistor M4, the eighth transistor M8, and the tenth transistor M10 may be turned on.

When the third transistor M3 is turned on, the third input terminal 103 and the seventh node N7 may be electrically coupled to each other. Since the second clock signal CLK2 is not supplied to the third input terminal 103 during the first period t1, a high voltage may be supplied to the seventh node N7. However, the third capacitor C3 may charge a voltage corresponding to the turned-on state of the third transistor M3.

When the fourth transistor M4 is turned on, the fifth transistor M5 may be connected in the form of a diode between the third node N3 and the second power supply VSS. Hence, even when the fifth transistor M5 is turned on during the first period t1, the voltage of the second power supply VSS may not be transmitted to the third node N3, and the voltage of the third node N3 may be maintained at the voltage of the preceding state, e.g., the high voltage. Since the eleventh transistor M11 remains turned on, the high voltage of the third node N3 may be applied to the fifth node N5, and the fifth node N5 may be set to the high voltage. Thereby, the second transistor M2 and the sixth transistor M6 may be turned off.

When the eighth transistor M8 is turned on, the voltage of the first power supply VDD may be supplied to the first node N1. Hence, the ninth transistor M9 may be turned off.

When the tenth transistor M10 is turned on, the voltage of the second power supply VSS may be supplied to the output terminal 104. Therefore, during the first period t1, the emission control signal EM[i] may not be supplied to the emission control line Ei.

During a second period t2, the supply of the first clock signal CLK1 to the second input terminal 102 may be interrupted. When the supply of the first clock signal CLK1 is interrupted, the first transistor M1 and the fifth transistor M5 may be turned off. Here, the first node N1 and the second node N2 may maintain the voltages of the preceding period by the first capacitor C1 and the third capacitor C3. Since the first node N1 remains in the high voltage state, the ninth transistor M9 may remain turned off. Since the second node N2 remains in the low voltage state, the third transistor M3, the fourth transistor M4, the eighth transistor M8, and the tenth transistor M10 may remain turned on.

During the second period t2, the second clock signal CLK2 may be supplied to the third input terminal 103. The seventh transistor M7 may be turned on by the second clock signal CLK2 supplied to the third input terminal 103. When the seventh transistor M7 is turned on, the first node N1 and the sixth node N6 may be electrically coupled to each other. Hence, the sixth node N6 may be set to the high voltage.

During the second period t2, the second clock signal CLK2 may be supplied to the seventh node N7 via the third transistor M3 that is turned on. Therefore, a low voltage is supplied to the seventh node N7. Then, the voltage of the second node N2 may be maintained at a voltage (a 2-step low voltage) less than the voltage of the second power supply VSS by coupling of the third capacitor C3.

During a third period t3, the supply of the second clock signal CLK2 to the third input terminal 103 may be interrupted. If the supply of the second clock signal CLK2 is interrupted, the seventh transistor M7 may be turned off.

During the third period t3, the start signal FLM or the emission control signal EM[i−1] of the preceding stage may be supplied to the first input terminal 101, and the first clock signal CLK1 may be supplied to the second input terminal 102. When the first clock signal CLK1 is supplied to the second input terminal 102, the first transistor M1 and the fifth transistor M5 may be turned on.

When the first transistor M1 is turned on, the first input terminal 101 and the fourth node N4 may be electrically coupled to each other. Since the twelfth transistor M12 remains turned on, the first input terminal 101 may also be electrically coupled with the second node N2 via the fourth node N4. Then, the fourth node N4 and the second node N2 may be set to the high voltage by the start signal FLM or the emission control signal EM[i−1] of the preceding stage that is supplied to the first input terminal 101. When the fourth node N4 and the second node N2 are set to the high voltage, the third transistor M3, the fourth transistor M4, the eighth transistor M8, and the tenth transistor M10 may be turned off.

If the fifth transistor M5 is turned on, the low voltage of the second power supply VSS may be applied to the third node N3 so that the third node N3 and the fifth node N5 are set to the low voltage. Thereby, the second transistor M2 and the sixth transistor M6 may be turned on.

If the second transistor M2 is turned on, the voltage of the first power supply VDD may be applied to the seventh node N7. Hence, the seventh node N7 may be maintained at the high voltage. Here, since the third transistor M3 remains turned off, the voltage of the second clock signal CLK2 to be applied to the third input terminal 103 may not be transmitted to the seventh node N7. Furthermore, since both the seventh node N7 and the second node N2 that are the opposite ends of the third capacitor C3 are maintained at the high voltage, the third capacitor C3 may not be charged or discharged. Here, a current path may be formed from the first power supply VDD to the second node N2 via the second transistor M2, and the high voltage of the first power supply VDD may be transmitted to the second node N2. Hence, the voltage of the second node N2 may be stably maintained at the high level.

If the sixth transistor M6 is turned on, the third input terminal 103 and the sixth node N6 may be electrically coupled to each other. Since the second clock signal CLK2 is not supplied to the third input terminal 103 during the third period t3, the sixth node N6 may be maintained at the high voltage. Here, since the seventh transistor M7 remains turned off, the voltage of the sixth node N6 may not affect the voltage of the first node N1. The second capacitor C2 may store a voltage corresponding to the turn-on level of the sixth transistor M6.

During a fourth period t4, the second clock signal CLK2 may be supplied to the third input terminal 103. If the second clock signal CLK2 is supplied to the third input terminal 103, the seventh transistor M7 may be turned on.

If the seventh transistor M7 is turned on, the first node N1 and the sixth node N6 may be electrically coupled to each other. Here, the low voltage of the second clock signal CLK2 that is supplied to the third input terminal 103 via the sixth transistor M6 that remains turned on may be supplied to the sixth node N6 and the first node N1. When the low voltage is supplied to the first node N1, the ninth transistor M9 may be turned on.

If the ninth transistor M9 is turned on, the voltage of the first power supply VDD may be supplied to the output terminal 104. The voltage of the first power supply VDD that is supplied to the output terminal 104 may be supplied to the i-th emission control line Ei as the emission control signal EM[i].

During a fifth period t5, the supply of the second clock signal CLK2 to the third input terminal 103 may be interrupted. If the supply of the second clock signal CLK2 is interrupted, the seventh transistor M7 may be turned off. Here, the first node N1 may be stably maintained at the high voltage by the first capacitor C1. Thereby, the ninth transistor M9 may remain turned on, and the voltage of the first power supply VDD may be supplied to the i-th emission control line Ei as the emission control signal EM[i].

Although the supply of the second clock signal CLK2 is interrupted during the fifth period t5, the third transistor M3 remains turned off and, therefore, the voltage of the second clock signal CLK2 may not be supplied to the seventh node N7 and may not affect the voltage of the second node N2.

As described above, in exemplary embodiments of the present invention, during the supply of the emission control signal EM[i], the third transistor M3 that remains turned off may prevent a change in voltage of the second clock signal CLK2 from affecting the second node N2, whereby the second node N2 may be stably maintained at the high voltage. Furthermore, in exemplary embodiments of the present invention, during the supply of the emission control signal EM[i], the third capacitor C3 may be prevented from being charged or discharged. In other words, the third capacitor C3 may not perform a charging or discharging operation at any time other than when the voltage of the second node N2 is set to the low level by the coupling of the third capacitor C3. Therefore, in exemplary embodiments of the present invention during the supply of the emission control signal EM[i], the third capacitor C3 may not act as a load. Consequently, the power consumption may be reduced, and reliable output of the emission control signal EM[i] may be secured.

Figure 6:
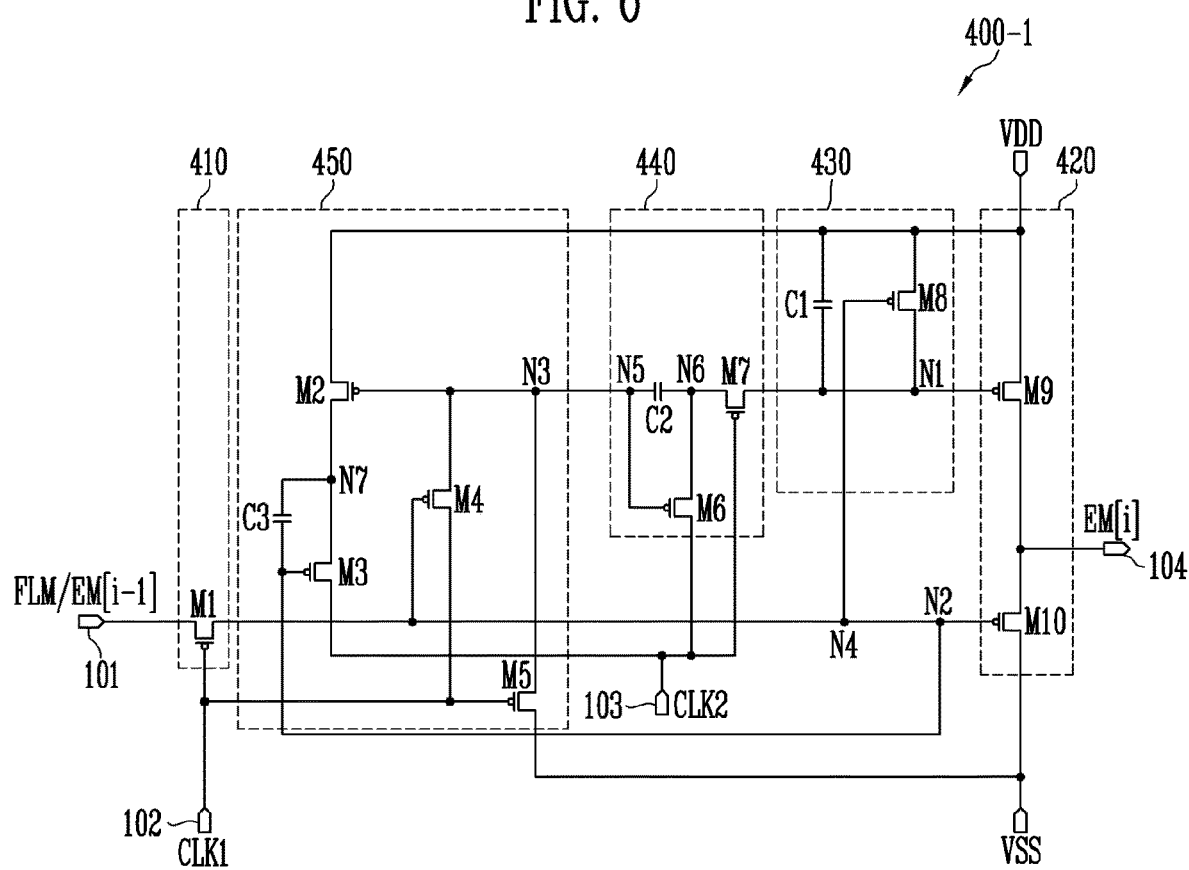
FIG. 6 is a circuit diagram of a stage illustrated in FIG. 2 in accordance with a third exemplary embodiment of the present invention.

FIG. 6 is a circuit diagram of a stage illustrated in FIG. 2 in accordance with a third exemplary embodiment of the present invention. In FIG. 6, the same reference numerals are used to designate the same components as those of FIG. 3, and detailed description thereof will be omitted.

Referring to FIG. 6, the stage 400-1 in accordance with the third exemplary embodiment of the present invention may include an input circuit 410, an output circuit 420, a first signal processor 430, a second signal processor 440, and a third signal processor 450.

The stage 400-1 according to the third exemplary embodiment, except that the first and second stabilizers 461 and 462 are omitted, has the same configuration as that of FIG. 3. Therefore, detailed description of the process of the operation will be omitted.

In the exemplary embodiment illustrated in FIG. 3, each of the first stabilizer 461 and the second stabilizer 462 may include a transistor that always remains turned on. The transistors of the first stabilizer 461 and the second stabilizer 462 may be provided to reliably control a voltage drop width of the third node N3 and the second node N2 illustrated in FIG. 3, and may not substantially affect the operation of the circuit. Therefore, even if the first stabilizer 461 and the second stabilizer 462 are omitted, the operating process of the circuit illustrated in FIG. 5 remains unchanged, but the second node N2 and the fourth node N4 may be substantially the same node, and the third node N3 and the fifth node N5 may be substantially the same node.

Although FIG. 6 illustrates an example in which both the first stabilizer 461 and the second stabilizer 462 are omitted, the inventive concepts are not limited thereto. In other words, in exemplary embodiments of the invention, the stage 400-1 may be configured such that only either the first stabilizer 461 or the second stabilizer 462 is omitted.

Figure 7:
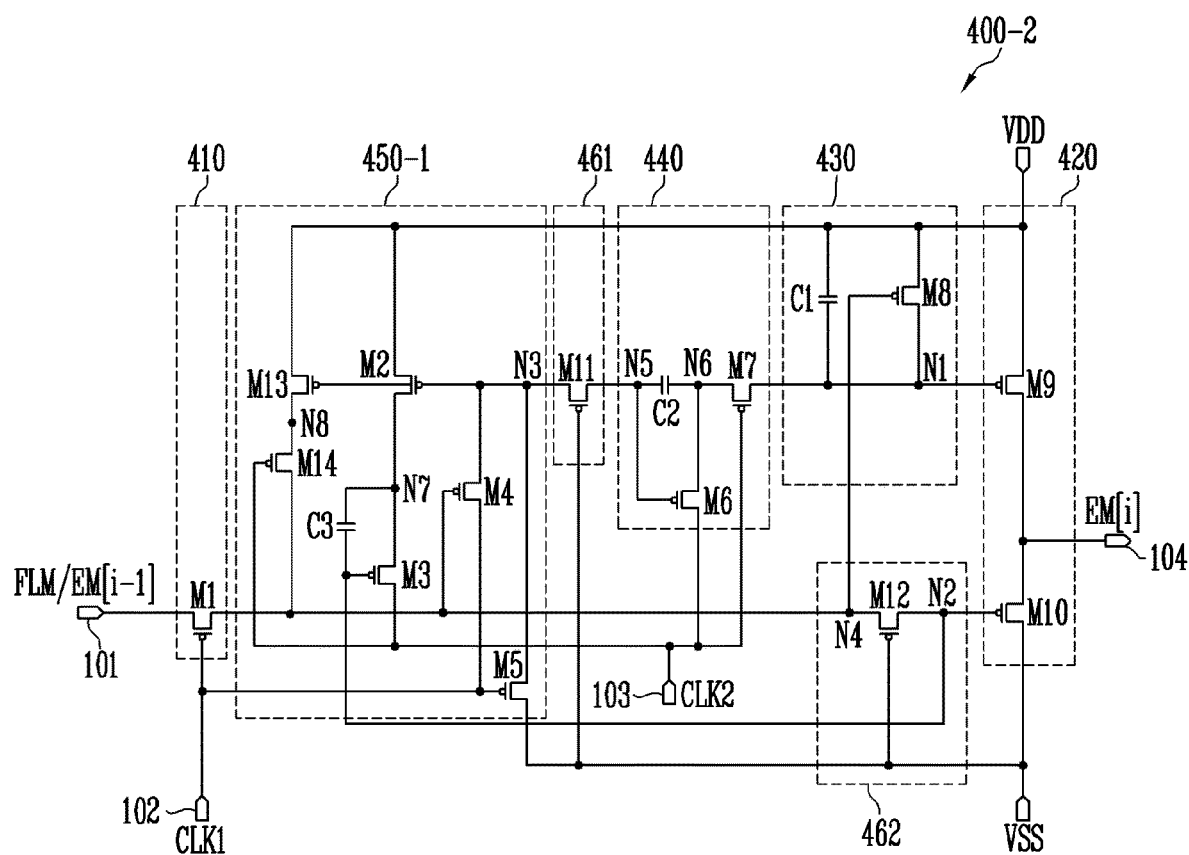
FIG. 7 is a circuit diagram of a stage illustrated in FIG. 2 in accordance with a fourth exemplary embodiment of the present invention.

FIG. 7 is a circuit diagram of a stage illustrated in FIG. 2 in accordance with a fourth exemplary embodiment of the present invention. Although FIG. 7 illustrates only an i-th stage, other stages to be described below may have the same structure as that of the i-th stage illustrated in FIG. 2.

Referring to FIGS. 1, 2, and 7, the stage 400-2 in accordance with the fourth embodiment of the present invention may include an input circuit 410, an output circuit 420, a first signal processor 430, a second signal processor 440, a third signal processor 450-1, a first stabilizer 461, and a second stabilizer 462.

The configuration of the stage 400-2 according to the fourth exemplary embodiment, except that the third signal processor 450-1 further includes a thirteenth transistor M13 and a fourteenth transistor M14, is the same as that of the exemplary embodiment of FIG. 3. Therefore, detailed descriptions of the other components will be omitted.

The thirteenth transistor M13 is coupled between the first power supply VDD and an eighth node N8. A gate electrode of the thirteenth transistor M13 is coupled to the third node N3. The thirteenth transistor M13 may be turned on in response to the voltage of the fifth node N5 so that the voltage of the first power supply VDD may be supplied to the eighth node N8.

The fourteenth transistor M14 is coupled between the eighth node N8 and the fourth node N4. A gate electrode of the fourteenth transistor M14 is coupled to the third input terminal 103. When the second clock signal CLK2 is supplied to the third input terminal 103, the fourteenth transistor M14 may be turned on to electrically couple the eighth node N8 and the fourth node N4.

In exemplary embodiments of the present invention, each of the thirteenth and fourteenth transistors M13 and M14 may be formed of a p-type transistor. In these exemplary embodiments, the gate-on voltage of the thirteenth and fourteenth transistors M13 and M14 may be set to a low level, and the gate-off voltage thereof may be set to a high level.

Figure 8:
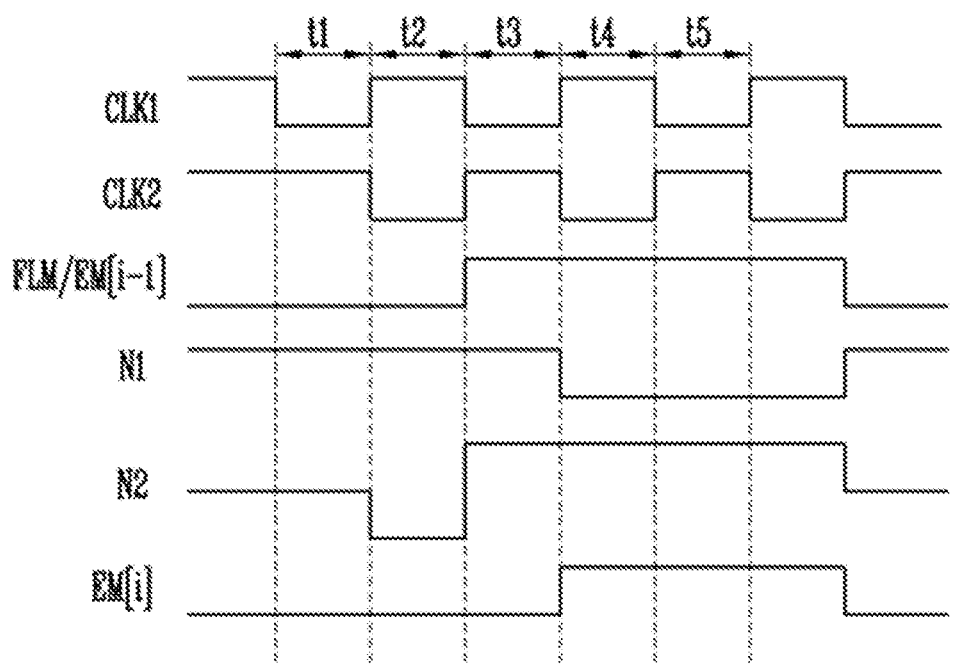
FIG. 8 is a waveform diagram illustrating an operation of the stage illustrated in FIG. 7.

FIG. 8 is a waveform diagram illustrating an operation of the stage illustrated in FIG. 7. For the sake of explanation, FIG. 8 illustrates the operation of only the i-th stage.

A process of the operation will be described. First, during a first period t1, the first clock signal CLK1 may be supplied to the second input terminal 102. Thereby, the first transistor M1 and the fifth transistor M5 may be turned on. Furthermore, during the first period t1, the second clock signal CLK2 may not be supplied to the third input terminal 103. Thereby, the seventh transistor M7 and the fourteenth transistor M14 may be turned off.

When the first transistor M1 is turned on, the first input terminal 101 and the fourth node N4 may be electrically coupled to each other. Since the twelfth transistor M12 remains turned on, the first input terminal 101 may also be electrically coupled with the second node N2 via the fourth node N4.

Since during the first period t1 the start signal FLM or the emission control signal EM[i−1] of the preceding stage to be supplied to the first input terminal 101 has the low level, a low voltage (e.g., the voltage of the second power supply VSS) may be applied to the fourth node N4 and the second node N2. When the fourth node N4 and the second node N2 are set to the low voltage, the third transistor M3, the fourth transistor M4, the eighth transistor M8, and the tenth transistor M10 may be turned on.

When the third transistor M3 is turned on, the third input terminal 103 and the seventh node N7 may be electrically coupled to each other. Since the second clock signal CLK2 is not supplied to the third input terminal 103 during the first period t1, the high voltage may be supplied to the seventh node N7. Here, the third capacitor C3 may charge a voltage corresponding to the turned-on state of the third transistor M3.

When the fourth transistor M4 is turned on, the fifth transistor M5 may be connected in the form of a diode between the third node N3 and the second power supply VSS. Hence, even when the fifth transistor M5 is turned on during the first period t1, the voltage of the second power supply VSS may not be transmitted to the third node N3, and the voltage of the third node N3 may be maintained at the voltage of the preceding state, e.g., the high voltage. Since the eleventh transistor M11 remains turned on, the high voltage of the third node N3 may be applied to the fifth node N5, and the fifth node N5 may be set to the high voltage. Thereby, the second transistor M2, the sixth transistor M6, and thirteenth transistor M13 may be turned off.

When the eighth transistor M8 is turned on, the voltage of the first power supply VDD may be supplied to the first node N1. Hence, the ninth transistor M9 may be turned off.

When the tenth transistor M10 is turned on, the voltage of the second power supply VSS may be supplied to the output terminal 104. Therefore, during the first period t1, the emission control signal EM[i] may not be supplied to the emission control line Ei.

During a second period t2, the supply of the first clock signal CLK1 to the second input terminal 102 may be interrupted. When the supply of the first clock signal CLK1 is interrupted, the first transistor M1 and the fifth transistor M5 may be turned off. Here, the first node N1 and the second node N2 may maintain the voltages of the preceding period by the first capacitor C1 and the third capacitor C3. Since the first node N1 remains in the high voltage state, the ninth transistor M9 may remain turned off. Since the second node N2 remains in the low voltage state, the third transistor M3, the fourth transistor M4, the eighth transistor M8, and the tenth transistor M10 may remain turned on.

During the second period t2, the second clock signal CLK2 may be supplied to the third input terminal 103. The seventh transistor M7 and the fourteenth transistor M14 may be turned on by the second clock signal CLK2 supplied to the third input terminal 103. If the seventh transistor M7 is turned on, the first node N1 and the sixth node N6 may be electrically coupled to each other. Since the eighth transistor M8 remains turned on, the voltage of the first node N1 may be maintained at a high level, and the sixth node N6 coupled with the first node N1 through the seventh transistor M7 may be maintained at the high voltage.

When the fourteenth transistor M14 is turned on, the fourth node N4 and the eighth node N8 may be electrically connected to each other, and the eighth node N8 may be set to the low voltage.

During the second period t2, the second clock signal CLK2 may be supplied to the seventh node N7 via the third transistor M3 that is turned on. Therefore, the low voltage is supplied to the seventh node N7. Then, the voltage of the second node N2 may be maintained at a voltage (a 2-step low voltage) less than the voltage of the second power supply VSS by coupling of the third capacitor C3.

During a third period t3, the supply of the second clock signal CLK2 to the third input terminal 103 may be interrupted. When the supply of the second clock signal CLK2 is interrupted, the seventh transistor M7 and the fourteenth transistor M14 may be turned off.

During the third period t3, the start signal FLM or the emission control signal EM[i−1] of the preceding stage may be supplied to the first input terminal 101, and the first clock signal CLK1 may be supplied to the second input terminal 102. When the first clock signal CLK1 is supplied to the second input terminal 102, the first transistor M1 and the fifth transistor M5 may be turned on.

When the first transistor M1 is turned on, the first input terminal 101 and the fourth node N4 may be electrically coupled to each other. Since the twelfth transistor M12 remains turned on, the first input terminal 101 may also be electrically coupled with the second node N2 via the fourth node N4. Then, the fourth node N4 and the second node N2 may be set to the high voltage by the start signal FLM or the emission control signal EM[i−1] of the preceding stage that is supplied to the first input terminal 101. When the fourth node N4 and the second node N2 are set to the high voltage, the third transistor M3, the fourth transistor M4, the eighth transistor M8, and the tenth transistor M10 may be turned off.

If the fifth transistor M5 is turned on, the low voltage of the second power supply VSS may be applied to the third node N3 so that the third node N3 and the fifth node N5 are set to the low voltage. Thereby, the second transistor M2, the sixth transistor M6, and thirteenth transistor M13 may be turned on.

If the second transistor M2 is turned on, the voltage of the first power supply VDD may be applied to the seventh node N7. Hence, the seventh node N7 may be maintained at the high voltage. Here, since the third transistor M3 remains turned off, the voltage of the second clock signal CLK2 to be applied to the third input terminal 103 may not be transmitted to the seventh node N7. Furthermore, since both the seventh node N7 and the second node N2 that are the opposite ends of the third capacitor C3 are maintained at the high voltage, the third capacitor C3 may not be charged or discharged. Here, a current path may be formed from the first power supply VDD to the second node N2 via the second transistor M2, and the high voltage of the first power supply VDD may be transmitted to the second node N2. Hence, the voltage of the second node N2 may be stably maintained at the high level.

If the sixth transistor M6 is turned on, the third input terminal 103 and the sixth node N6 may be electrically coupled to each other. Since the second clock signal CLK2 is not supplied to the third input terminal 103 during the third period t3, the sixth node N6 may be maintained at the high voltage. Here, since the seventh transistor M7 remains turned off, the voltage of the sixth node N6 may not affect the voltage of the first node N1. The second capacitor C2 may store a voltage corresponding to the turn-on level of the sixth transistor M6.

If the thirteenth transistor M13 is turned on, the voltage of the first power supply VDD may be applied to the eighth node N8. Hence, the eighth node N8 may be set to the high voltage.

During a fourth period t4, the second clock signal CLK2 may be supplied to the third input terminal 103. When the second clock signal CLK2 is supplied to the third input terminal 103, the seventh transistor M7 and the fourteenth transistor M14 may be turned on.

If the seventh transistor M7 is turned on, the first node N1 and the sixth node N6 may be electrically coupled to each other. Here, the low voltage of the second clock signal CLK2 that is supplied to the third input terminal 103 via the sixth transistor M6 that remains turned on may be supplied to the sixth node N6 and the first node N1. When the low voltage is supplied to the first node N1, the ninth transistor M9 may be turned on.

If the ninth transistor M9 is turned on, the voltage of the first power supply VDD may be supplied to the output terminal 104. The voltage of the first power supply VDD that is supplied to the output terminal 104 may be supplied to the i-th emission control line Ei as the emission control signal EM[i].

When the fourteenth transistor M14 is turned on, a current path may be formed from the first power supply VDD to the second node N2 via the thirteenth and fourteenth transistors M13 and M14, and the high voltage of the first power supply VDD may be transmitted to the second node N2. Hence, the voltage of the second node N2 may be more stably maintained at the high level.

As described above, in exemplary embodiments of the present invention, during the supply of the emission control signal EM[i], the third transistor M3 that remains turned off may prevent a change in voltage of the second clock signal CLK2 from affecting the second node N2, whereby the second node N2 may be stably maintained at the high voltage. Furthermore, in exemplary embodiments of the present invention, during the supply of the emission control signal EM[i], the third capacitor C3 may be prevented from being charged or discharged. In other words, the third capacitor C3 may not perform a charging or discharging operation at any time other than when the voltage of the second node N2 is set to the low level by the coupling of the third capacitor C3. Therefore, in exemplary embodiments of the present invention, during the supply of the emission control signal EM[i], the third capacitor C3 may not be used as a load. Consequently, the power consumption may be reduced, and reliable output of the emission control signal EM[i] may be secured.

Figure 9:
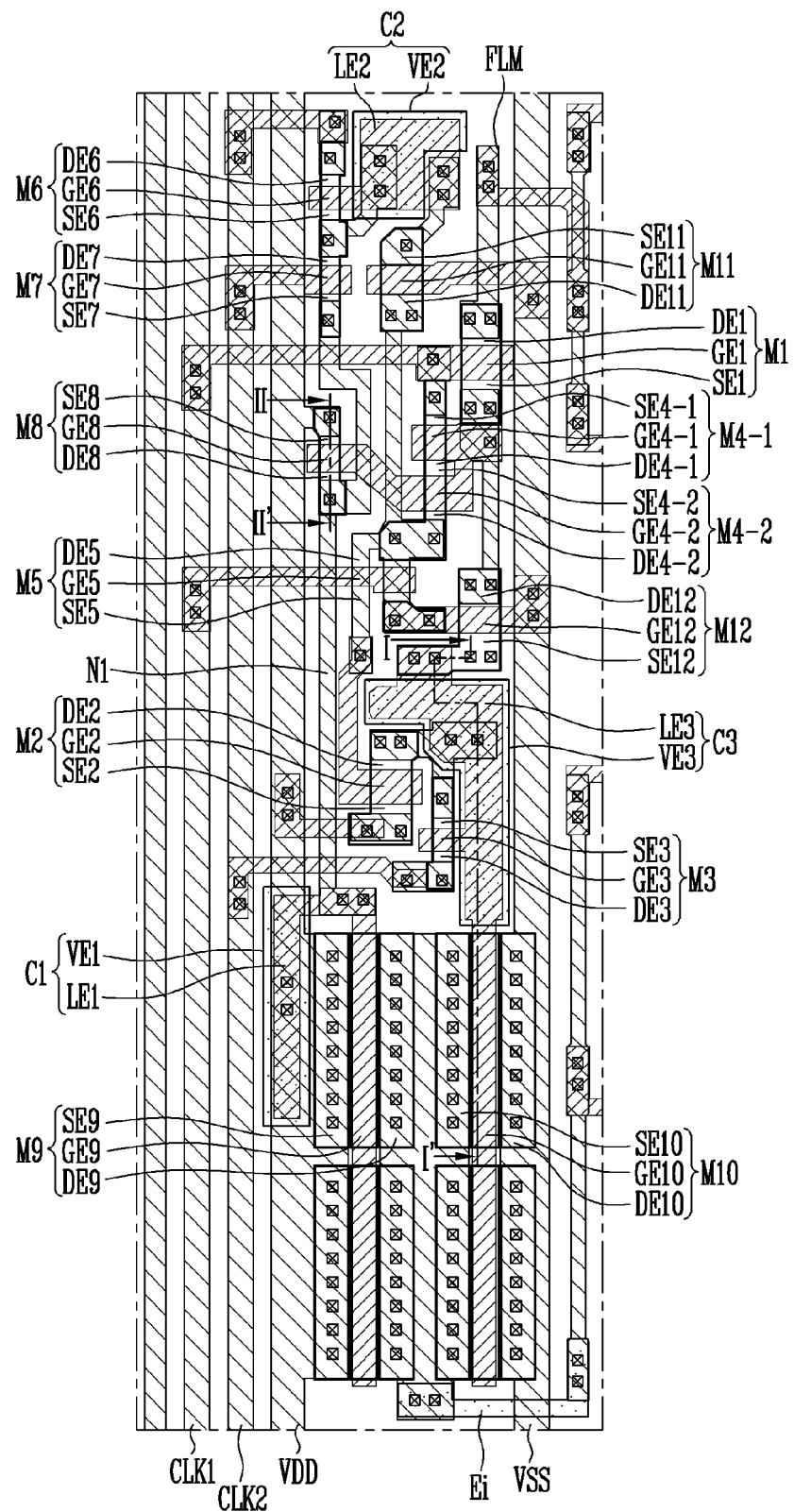
FIG. 9 is a plan view illustrating the layout of a stage in accordance with an exemplary embodiment of the present invention.
Figure 10:
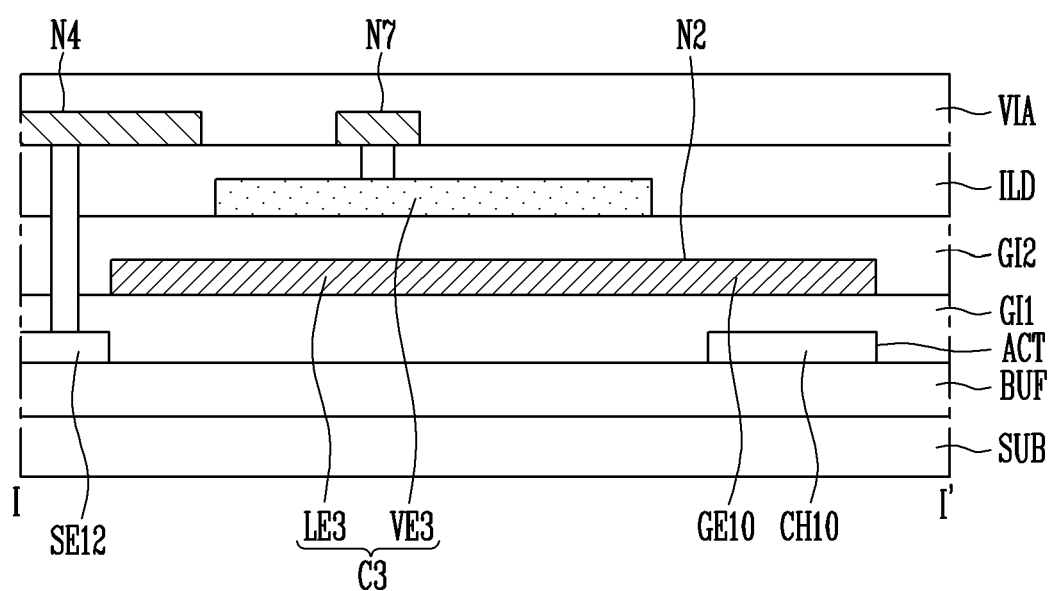
FIG. 10 is a sectional view taken along line I-I' of FIG. 9.

FIG. 9 is a plan view illustrating an example of the layout of a stage in accordance with an exemplary embodiment of the present invention. FIG. 10 is a sectional view taken along line I-I. Particularly, FIGS. 9 and 10 illustrate the layout of the stage shown in FIG. 4.

Referring to FIGS. 4, 9, and 10, the substrate SUB may be formed of a rigid substrate or a flexible substrate. Examples of the rigid substrate may include a glass substrate, a quartz substrate, a glass ceramic substrate, and a crystalline glass substrate.

Examples of the flexible substrate may include a film substrate and a plastic substrate, each of which includes polymer organic material. For example, the flexible substrate may include one of polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), triacetate cellulose (TAC), and cellulose acetate propionate (CAP). Furthermore, the flexible substrate may include fiber glass reinforced plastic (FRP).

A buffer layer BUF may cover the substrate SUB. The buffer layer BUF may prevent impurities from diffusing from the substrate SUB to an active layer ACT. The buffer layer BUF may be an inorganic insulating layer. For example, the buffer layer BUF may be formed of silicon nitride ($SiN_x$), silicon oxide ($SiO_x$), silicon oxynitride ($SiO_xN_y$), or a combination thereof. The buffer layer BUF may be omitted depending on the material of the substrate SUB and processing conditions.

The active layer ACT may be provided on the buffer layer BUF. The active layer ACT is formed of semiconductor material. For example, the active layer ACT may be formed of material such as poly silicon, amorphous silicon, or an oxide semiconductor. Undoped portions of the active layer ACT may form channels (e.g., CH10) of the transistors M1 to M12. Portions of the active layer ACT that are doped with impurities may form electrodes SE1 to SE12 and DE1 to DE12 or lines. The impurities may be p-type impurities. In some exemplary embodiments, the impurities may include at least one of p-type impurities, n-type impurities, and other metals.

A first gate insulating layer GI1 may cover the active layer ACT. The first gate insulating layer GI1 may cover source electrodes SE1 to SE12, drain electrodes DE1 to DE12, and channels (e.g., CH10) of the transistors M1 to M12. The first gate insulating layer GI1 may be an inorganic insulating layer. For example, the first gate insulating layer GI1 may be formed of silicon nitride ($SiN_x$), silicon oxide ($SiO_x$), silicon oxynitride ($SiO_xN_y$), or a combination thereof.

The gate electrodes GE1 to GE12 of the transistors M1 to M12 and a first electrode LE1 to LE3 of a storage capacitor C1 to C3 may be disposed on the first gate insulating layer GI1. The electrodes disposed on the first gate insulating layer GI1 may be formed of the same conductive material. For example, the electrodes on the first gate insulating layer GI1 may be made of molybdenum (Mo), titanium (Ti), aluminum (Al), silver (Ag), gold (Au), copper (Cu), or a combination thereof.

A second gate insulating layer GI2 may cover the first gate insulating layer GI1, the gate electrodes GE1 to GE12 of the transistors M1 to M12, and the first electrode LE1 to LE3 of the storage capacitor C1 to C3. The second gate insulating layer GI2 may be an inorganic insulating layer. For example, the second gate insulating layer GI2 may be formed of silicon nitride ($SiN_x$), silicon oxide ($SiO_x$), silicon oxynitride ($SiO_xN_y$), or a combination thereof.

A second electrode VE1 to VE3 of the storage capacitor C1 to C3 and an emission control line Ei may be disposed on the second gate insulating layer GI2. The electrodes and the lines that are disposed on the second gate insulating layer GI2 may be formed of the same conductive material. For example, the electrodes and the lines that are disposed on the second gate insulating layer GI2 may be made of molybdenum (Mo), titanium (Ti), aluminum (Al), silver (Ag), gold (Au), copper (Cu), or a combination thereof.

An interlayer insulating layer ILD may cover the second gate insulating layer GI2, the second electrode VE1 to VE3 of the storage capacitor C1 to C3, and the emission control line Ei. The interlayer insulating layer ILD may be an inorganic insulating layer. For example, the interlayer insulating layer ILD may be formed of silicon nitride ($SiN_x$), silicon oxide ($SiO_x$), silicon oxynitride ($SiO_xN_y$), or a combination thereof.

The first power supply VDD, the second power supply VSS, and supply lines for the first clock signal CLK1 and the second clock signal CLK2 may be disposed on the interlayer insulating layer ILD. The lines disposed on the interlayer insulating layer ILD may be made of the same conductive material. For example, the lines disposed on the first gate insulating layer GI1 may be made of molybdenum (Mo), titanium (Ti), aluminum (Al), silver (Ag), gold (Au), copper (Cu), or a combination thereof.

A via layer VIA may cover the interlayer insulating layer ILD. The via layer VIA may be an organic insulating layer. For example, the via layer VIA may include at least one of polystyrene, polymethylmethacrylate (PMMA), polyacrylonitrile (PAN), polyamide (PA), polyimide (PI), polyarylether (PAE), a heterocyclic polymer, parylene, epoxy, benzocyclobutene (BCB), a siloxane-based resin, and a silane-based resin. In an exemplary embodiment, the via layer VIA may be an inorganic insulating layer, or may have a multilayer structure formed by alternately stacking organic insulating layers and inorganic insulating layers.

In exemplary embodiments of the present invention, other electrodes or lines may not disposed over or under a line extending from one electrode LE3 of the third capacitor C3 to the second node N2. Therefore, the second node N2 may be prevented from being affected by a field effect due to electrodes and/or lines which may be disposed over or under the second node N2. Thanks to the above-mentioned structure, the voltage of the second node N2 may be reliably maintained at a voltage to be controlled by the transistors M1 to M12.

In a stage and an emission control driver having the same in accordance with exemplary embodiments of the present invention, while an emission control signal is maintained at a low voltage, the voltage of a node for controlling the output of the emission control signal may be stably maintained at a high voltage. Therefore, a flicker phenomenon of a display device may be prevented from occurring due to an abnormal emission control signal.

Furthermore, in the stage and the emission control driver having the same in accordance with exemplary embodiments of the present invention, a capacitor provided in the stage may be prevented from being charged or discharged while the emission control signal is maintained at a low voltage, whereby the power consumption may be reduced regardless of a non-emission section ratio (referred to an off ratio) in a frame period.

The invention should not be construed as being limited to the exemplary embodiments set forth herein. Rather, these exemplary embodiments are provided so that this disclosure will be thorough and complete and will fully convey the concept of the invention to those skilled in the art.

Although certain exemplary embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A stage circuit comprising:
    an output circuit configured to supply a voltage of a first power supply or a voltage of a second power supply to an output terminal in response to a voltage of a first node and a voltage of a second node;
    an input circuit configured to control a voltage of the second node and a voltage of a third node in response to respective signals supplied to a first input terminal and a second input terminal;
    a first signal processor configured to control the voltage of the first node in response to the voltage of the second node;
    a second signal processor coupled between the first node and the third node, and configured to control the voltage of the first node in response to an output voltage of a third signal processor and a signal supplied to a third input terminal; and
    the third signal processor configured to control the voltage of the second node in response to a signal supplied to the first input terminal,
    wherein the third signal processor comprises:
        a first capacitor coupled between the first power supply and the second node; and
        a third transistor coupled between the first power supply and the third input terminal, and including a gate electrode coupled to the second node, and
    wherein the input circuit comprises a first transistor coupled between the first input terminal and the second node, the first transistor including a gate electrode coupled to the second input terminal.

2. The stage circuit according to claim 1, wherein, when the voltage of the first power supply is supplied to the output terminal in response to the voltage of the second node, the third transistor is turned off so that a path of current flowing from the third input terminal to the second node is blocked.

3. The stage circuit according to claim 1, wherein a difference in potential between opposite end terminals of the first capacitor remains constant while the voltage of the first power supply is supplied to the output terminal in response to the voltage of the second node.

4. The stage circuit according to claim 1, wherein:
the third signal processor further comprises a second transistor coupled between the first power supply and a common node between the first capacitor and the third transistor, the second transistor including a gate electrode coupled to the third node; and
when the voltage of the first power supply is supplied to the output terminal in response to the voltage of the second node, the voltage of the first power supply is applied to the second node via the second transistor and the first capacitor.

5. The stage circuit according to claim 4, wherein the third signal processor further comprises:
a fourth transistor coupled between the third node and the second input terminal, and including a gate electrode coupled to the second node; and
a fifth transistor coupled between the third node and the second power supply, and including a gate electrode coupled to the second input terminal.

6. The stage circuit according to claim 5, wherein:
the fourth transistor comprises a plurality of sub-transistors coupled in series between the third node and the second input terminal; and
gate electrodes of the plurality of sub-transistors are coupled to the second node.

7. The stage circuit according to claim 5, wherein the third signal processor comprises:
a thirteenth transistor coupled between the first power supply and an eighth node, and including a gate electrode coupled to the third node; and
a fourteenth transistor coupled between the eighth node and the second node, and including a gate electrode coupled to the third input terminal.

8. The stage circuit according to claim 1, wherein the second input terminal is supplied with a first clock signal, the third input terminal is supplied with a second clock signal, and the first clock signal and the second clock signal have identical waveforms with a phase difference of a half cycle or more.

9. The stage circuit according to claim 8, wherein a gate-on voltage section of the signal supplied to the first input terminal overlaps at least once with a gate-on voltage section of the first clock signal.

10. The stage circuit according to claim 1, wherein the second signal processor comprises:
a second capacitor coupled between the third node and a sixth node;
a sixth transistor coupled between the sixth node and the third input terminal, and including a gate electrode coupled to the third node; and
a seventh transistor coupled between the first node and the sixth node, and including a gate electrode coupled to the third input terminal.

11. The stage circuit according to claim 1, wherein the first signal processor comprises:
a second capacitor coupled between the first power supply and the first node; and
an eighth transistor coupled between the first power supply and the first node, and including a gate electrode coupled to the second node.

12. The stage circuit according to claim 1, wherein the output circuit comprises:
a ninth transistor coupled between the first power supply and the output terminal, and including a gate electrode coupled to the first node; and
a tenth transistor coupled between the output terminal and the second power supply, and including a gate electrode coupled to the second node.

13. The stage circuit according to claim 1, further comprising a first stabilizer coupled between the second signal processor and the third signal processor and configured to control a voltage drop width of the third node.

14. The stage circuit according to claim 13, further comprising a second stabilizer coupled between the second node and a fourth node coupled to the first input terminal, the second stabilizer being configured to control a voltage drop width of the second node.

15. The stage circuit according to claim 1, further comprising:
a first gate insulating layer configured to cover a source electrode and a drain electrode of at least one transistor;
a second gate insulating layer configured to cover a gate electrode of the at least one transistor and a first electrode of at least one capacitor; and
an interlayer insulating layer configured to cover a second electrode of the at least one capacitor,
wherein:
the second gate insulating layer covers a line extending from the gate electrode of the third transistor to the second node; and
the line is disposed not to overlap with the source electrode and the drain electrode that are covered with the first gate insulating layer, or the second electrode that is covered with the interlayer insulating layer.

16. An emission control driver comprising a plurality of stage circuits configured to supply emission signals to emission control lines,
wherein:
each of the stage circuits comprises:
an output circuit configured to supply a voltage of a first power supply or a voltage of a second power supply to an output terminal in response to a voltage of a first node and a voltage of a second node;
an input circuit configured to control a voltage of the second node and a voltage of a third node in response to respective signals supplied to a first input terminal and a second input terminal;
a first signal processor configured to control the voltage of the first node in response to the voltage of the second node;
a second signal processor connected between the first node and the third node, and configured to control the voltage of the first node in response to a signal supplied to the second input terminal and a signal supplied to a third input terminal; and
a third signal processor configured to control the voltage of the second node in response to a signal supplied to the first input terminal; and
the third signal processor comprises:
a first capacitor coupled between the first power supply and the second node; and
a third transistor coupled between the first power supply and the third input terminal, and including a gate electrode coupled to the second node,
wherein the input circuit comprises a first transistor coupled between the first input terminal and the second node, the first transistor including a gate electrode coupled to the second input terminal.

17. The emission control driver according to claim 16, wherein, when the voltage of the first power supply is supplied to the output terminal in response to the voltage of the second node, the third transistor is turned off so that a path of current flowing from the third input terminal to the second node is blocked.

18. The emission control driver according to claim 16, wherein a difference in potential between opposite ends of the first capacitor remains constant while the voltage of the first power supply is supplied to the output terminal in response to the voltage of the second node.

* * * * *